(12) United States Patent
Ahn et al.

(10) Patent No.: US 11,037,623 B2
(45) Date of Patent: Jun. 15, 2021

(54) SEMICONDUCTOR MEMORY DEVICE

(71) Applicant: SK hynix Inc., Gyeonggi-do (KR)

(72) Inventors: Chang-Yong Ahn, Seoul (KR); Han-Suk Ko, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/597,512

(22) Filed: Oct. 9, 2019

(65) Prior Publication Data

US 2020/0234764 A1 Jul. 23, 2020

(30) Foreign Application Priority Data

Jan. 22, 2019 (KR) .................. 10-2019-0008122

(51) Int. Cl.
*G11C 13/00* (2006.01)
*G11C 29/38* (2006.01)
(52) U.S. Cl.
CPC ........ *G11C 13/0069* (2013.01); *G11C 13/004* (2013.01); *G11C 13/0004* (2013.01); *G11C 13/0021* (2013.01); *G11C 13/0064* (2013.01); *G11C 29/38* (2013.01)
(58) Field of Classification Search
CPC . G11C 13/0069; G11C 13/0064; G11C 29/38; G11C 13/004; G11C 13/0004; G11C 13/0021; G11C 2013/0076
See application file for complete search history.

(56) References Cited

U.S. PATENT DOCUMENTS

| 7,360,116 | B2* | 4/2008 | Nakamura | ....... G01R 31/31813 |
| | | | | 714/30 |
| 7,830,726 | B2* | 11/2010 | Huang | .................... G11C 13/00 |
| | | | | 365/189.14 |
| 2011/0289270 | A1* | 11/2011 | Bell, Jr. | ................ G06F 16/957 |
| | | | | 711/112 |
| 2017/0076768 | A1* | 3/2017 | Son | ...................... G11C 16/102 |
| 2018/0129561 | A1* | 5/2018 | Niu | ...................... G06F 11/1068 |
| 2020/0210103 | A1* | 7/2020 | Sforzin | ............... G11C 11/5678 |
| 2020/0364109 | A1* | 11/2020 | Iwaki | ...................... G06F 12/00 |

FOREIGN PATENT DOCUMENTS

KR        10-0772998        11/2007

* cited by examiner

*Primary Examiner* — Tri M Hoang
(74) *Attorney, Agent, or Firm* — IP & T Group LLP

(57) ABSTRACT

A semiconductor memory device includes a memory cell array, a storage circuit suitable for storing pattern data, a data input circuit suitable for receiving normal write data from an external device, a comparison circuit suitable for comparing the pattern data with the normal write data based on a pre-read control signal, and generating a comparison signal corresponding to the comparison result, and a write circuit suitable for writing the pattern data to the memory cell array based on a pre-write control signal, and writing some of the normal write data to the memory cell array based on a normal write control signal and the comparison signal.

18 Claims, 4 Drawing Sheets

FIG. 2

| Signal | Data values |
|---|---|
| PT_DATA | 1 0 1 0 1 0 1 0 1 0 1 0 1 0 1 0 |
| IP_DATA | 1 0 1 0 1 0 1 0 0 0 0 0 0 0 0 0 |
| WT_DATA | 0 0 0 0 |

FIG. 4

| Signal | Data values |
|---|---|
| PT_DATA/ PRE_DATA | 1 0 1 0 1 0 1 0 1 0 1 0 1 0 1 0 |
| IP_DATA | 1 0 1 0 1 0 1 0 0 0 0 0 0 0 0 0 |
| WT_DATA | 0 0 0 0 |

SEMICONDUCTOR MEMORY DEVICE

CROSS-REFERENCE TO RELATED APPLICATION

This application claims priority under 35 U.S.C. § 119 to Korean Patent Application No. 10-2019-0008122, filed on Jan. 22, 2019, the disclosure of which is incorporated herein by reference in its entirety.

BACKGROUND

1. Field

Various embodiments of the present invention relate to a semiconductor design technique, and more particularly, to a semiconductor memory device.

2. Description of the Related Art

A semiconductor memory device stores write data inputted from a control device, e.g., a host, according to a write mode. Generally, when the write data is stored, a considerable amount of power is consumed due to the characteristics of the semiconductor memory device. Particularly, the power consumption of a phase change random access memory (RAM) is many times higher than that of a dynamic RAM.

In addition, some memory cells selected among memory cells included in the semiconductor memory device may be accessed in the write mode. The number of accesses may determine the lifespans of the selected memory cells. In other words, the increase in the number of accesses shortens the lifespans of the selected memory cells.

Accordingly, there is a need for a method of reducing the power consumption and increasing the lifespans of the memory cells in the write mode.

SUMMARY

Various embodiments of the present invention are directed to a semiconductor memory device capable of minimizing the number of memory cells which are accessed, that is, written, in a write mode.

In accordance with an embodiment, a semiconductor memory device includes: a memory cell array; a storage circuit suitable for storing pattern data; a data input circuit suitable for receiving normal write data from an external device; a comparison circuit suitable for comparing the pattern data with the normal write data based on a pre-read control signal, and generating a comparison signal corresponding to the comparison result; and a write circuit suitable for writing the pattern data to the memory cell array based on a pre-write control signal, and writing some of the normal write data to the memory cell array based on a normal write control signal and the comparison signal.

In accordance with an embodiment, a semiconductor memory device includes: a memory cell array; a storage circuit suitable for storing a plurality of pattern data, each having a pattern including a first data value and a second data value being patterned in a different order according to each application, and outputting selected pattern data among the plurality of pattern data based on a selection control signal; a data input circuit suitable for receiving normal write data from an external device, the normal write data being provided in response to the application; a write circuit suitable for writing the selected pattern data to the memory cell array based on a pre-write control signal; a read circuit suitable for reading the pattern data written to the memory cell array, based on a pre-read control signal; and a comparison circuit suitable for comparing the written pattern data with the normal write data, and generating a comparison signal corresponding to the comparison result, wherein the write circuit suitable writes some of the normal write data to the memory cell array based on a normal write control signal and the comparison signal.

In accordance with an embodiment, an operating method of a semiconductor memory device includes: writing pattern data to a memory cell array in a boot-up mode, the pattern data having a pattern in which a first data value and a second data value are patterned in a predetermined order; and comparing data values of the pattern data with data values of write data, and writing some of the data values of the write data to the memory cell array based on the comparison result, in a write mode.

In accordance with an embodiment, a memory device includes: a memory cell array including a plurality of cells, each cell including a variable resistance element; a storage circuit suitable for storing pattern data for target cells among the plurality of cells; a data input circuit suitable for receiving write data for the target cells; and a write circuit suitable for writing a part of the write data to the target cells, the part corresponding to a difference between the normal write data and the pattern data.

BRIEF DESCRIPTION OF THE DRAWINGS

FIG. 2 is a table illustrating an operation of a semiconductor memory device shown in FIG. 1.

FIG. 4 is a table illustrating an operation of a semiconductor memory device shown in FIG. 3.

DETAILED DESCRIPTION

Various embodiments of the present invention are described below in more detail with reference to the accompanying drawings. These embodiments are provided so that this disclosure is thorough and complete, and fully conveys the scope of the present invention to those skilled in the art.

Figure 1:
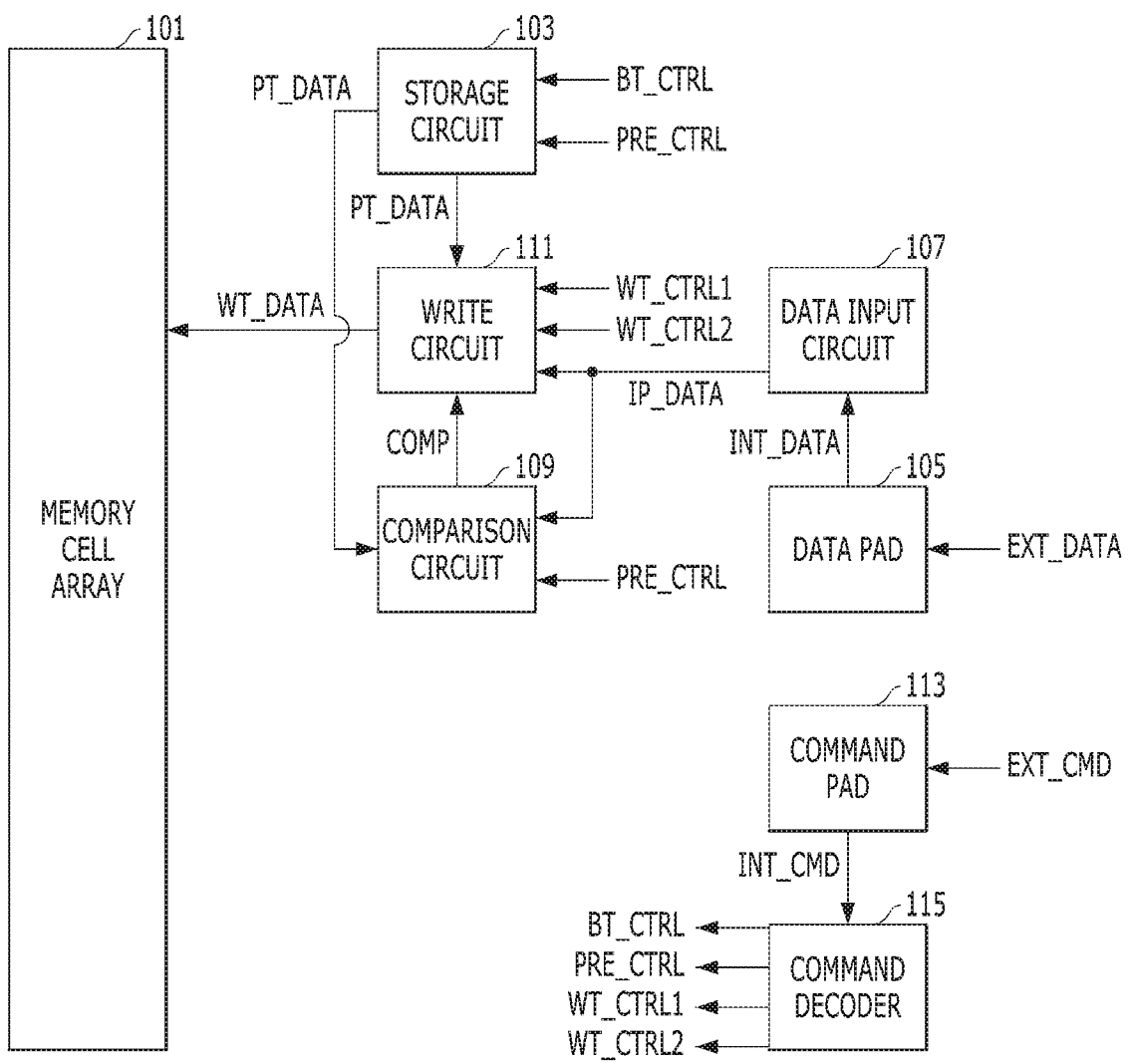
FIG. 1 is a block diagram illustrating a semiconductor memory device in accordance with an embodiment.

FIG. 1 is a block diagram illustrating a semiconductor memory device 100 in accordance with an embodiment.

Referring to FIG. 1, the semiconductor memory device 100 may include a memory cell array 101, a storage circuit 103, a data pad 105, a data input circuit 107, a comparison circuit 109, a write circuit 111, a command pad 113 and a command decoder 115.

The memory cell array 101 may include a plurality of memory cells (not illustrated). Each of the memory cells may include a variable resistance element. The variable resistance element may include a phase change material.

The storage circuit 103 may store pattern data PT_DATA. The pattern data PT_DATA refers to a pattern of data values which are frequently generated when a corresponding application is executed. The application refers to software such as an application program. In other words, the pattern data PT_DATA may be obtained by patterning a first data value, i.e., '0', and a second data value, i.e., in a predetermined order, according to the application. For example, the pattern data PT_DATA may include a pattern of '01010101' in which the first data values and the second data values are alternately patterned, or a pattern of '00001111' in which first data values and second data values are repeatedly patterned by a predetermined number. Alternatively, the pattern data PT_DATA may include a pattern in various ways depending on the application. The pattern data PT_DATA may be stored in the storage circuit 103 in a test mode. The storage circuit 103 may include, for example, a fuse circuit and a register.

The storage circuit 103 may output the pattern data PT_DATA to the write circuit 111 based on an output control signal BT_CTRL, and output the pattern data PT_DATA to the comparison circuit 109 based on a pre-read control signal PRE_CTRL.

The data pad 105 may transfer external write data EXT_DATA inputted from an external device, i.e., a host (not illustrated), as internal write data INT_DATA to the data input circuit 107.

The data input circuit 107 may generate normal write data IP_DATA based on the internal write data INT_DATA, and output the normal write data IP_DATA to the comparison circuit 109 and the write circuit 111. For example, the data input circuit 107 may include a general input buffer.

The comparison circuit 109 may compare the pattern data PT_DATA with the normal write data IP_DATA based on the pre-read control signal PRE_CTRL, and output a comparison signal COMP corresponding to the comparison result to the write circuit 111. For example, the comparison circuit 109 may compare data values of the normal write data IP_DATA with data values of the pattern data PT_DATA, and generate the comparison signal COMP as the comparison result. When the normal write data IP_DATA has 16-bit data values and the pattern data PT_DATA has 16-bit data values, the comparison signal COMP may have 16-bit comparison values. The comparison values may refer to the result values obtained by sequentially comparing the data values of the normal write data IP_DATA with the data values of the pattern data PT_DATA one bit by one bit. For example, each of the comparison values may have a logic value of '1' when the corresponding data value of the normal write data IP_DATA is equal to the corresponding data value of the pattern data PT_DATA, and have a logic value of '0' when the corresponding data value of the normal write data IP_DATA is different from the corresponding data value of the pattern data PT_DATA. For another example, each of the comparison values may have a logic value of '0' when the corresponding data value of the normal write data IP_DATA is equal to the corresponding data value of the pattern data PT_DATA, and have a logic value of '1' when the corresponding data value of the normal write data IP_DATA is different from the corresponding data value of the pattern data PT_DATA.

The write circuit 111 may write the pattern data PT_DATA as write data WT_DATA to the memory cell array 101 based on a pre-write control signal WT_CTRL1. In addition, the write circuit 111 may write some of the normal write data IP_DATA as the write data WT_DATA to the memory cell array 101 based on a normal write control signal WT_CTRL2 and the comparison signal COMP. For example, the write circuit 111 may write, to the memory cell array 101, only data values which are different from the data values of the pattern data PT_DATA, among the data values of the normal write data IP_DATA. Detailed descriptions thereof will be provided below (refer to FIG. 2).

The command pad 113 may output an external command signal EXT_CMD inputted from the external device as an internal command signal INT_CMD to the command decoder 115.

The command decoder 115 may generate the output control signal BT_CTRL, the pre-read control signal PRE_CTRL, the pre-write control signal WT_CTRL1 and the normal write control signal WT_CTRL2 based on the internal command signal INT_CMD. For example, the command decoder 115 may activate the output control signal BT_CTRL and the pre-write control signal WT_CTRL1 in a boot-up mode. For another example, the command decoder 115 may activate the pre-read control signal PRE_CTRL and the normal write control signal WT_CTRL2 in a write mode.

Hereinafter, an operation of the semiconductor memory device 100 having the aforementioned structure in accordance with the present embodiment will be described with reference to FIG. 2.

FIG. 2 is a table illustrating an operation of the semiconductor memory device 100 shown in FIG. 1.

Referring to FIG. 2, the pattern data PT_DATA may be stored in the storage circuit 103 in the test mode. For example, the pattern data PT_DATA may be stored in the storage circuit 103 through a fuse programming operation. The pattern data PT_DATA may have a pattern in which the first data values, i.e., '0's', and the second data values, i.e., '1's', are patterned in a predetermined order, according to the application. For example, the pattern data PT_DATA may include 16-bit data values, i.e., '1010101010101010'.

In the boot-up mode, when the external command signal EXT_CMD is inputted, the command pad 113 may transfer the external command signal EXT_CMD as the internal command signal INT_CMD to the command decoder 115. The command decoder 115 may activate the output control signal BT_CTRL and the pre-write control signal WT_CTRL1 based on the internal command signal INT_CMD. Accordingly, the storage circuit 103 may output the pattern data PT_DATA to the write circuit 111 based on the output control signal BT_CTRL, and the write circuit 111 may write the pattern data PT_DATA as the write data WT_DATA to the memory cell array 101 based on the pre-write control signal WT_CTRL1.

In the write mode, when the external command signal EXT_CMD is inputted, the command pad 113 may transfer the external command signal EXT_CMD as the internal command signal INT_CMD to the command decoder 115. The command decoder 115 may activate the pre-read control signal PRE_CTRL and the normal write control signal WT_CTRL2 based on the internal command signal INT_CMD. When the external write data EXT_DATA is inputted, the data pad 105 may transfer the external write data EXT_DATA as the internal write data INT_DATA to the data input circuit 107. The data input circuit 107 may generate the normal write data IP_DATA based on the internal write data INT_DATA. For example, the normal write data IP_DATA may include 16-bit data values, i.e., '1010101000000000'.

In the write mode, the storage circuit 103 may output the pattern data PT_DATA to the comparison circuit 109 based on the pre-read control signal PRE_CTRL. The comparison circuit 109 may compare the pattern data PT_DATA with the normal write data IP_DATA, and generate the comparison signal COMP corresponding to the comparison result. For example, the comparison circuit 109 may sequentially compare the data values of the pattern data PT_DATA, i.e., '1010101010101010', with the data values of the normal write data IP_DATA, i.e., '1010101000000000', and generate the comparison results for the respective data values as the comparison signal COMP. For example, the comparison signal COMP may include 16-bit logic values, i.e., '1111111101010101'. Accordingly, as shown in FIG. 2, the write circuit 111 may write only some data values ('0 0 0 0') of the normal write data IP_DATA as the write data WT_DATA to the memory cell array 101 based on the normal write control signal WT_CTRL2 and the comparison signal COMP. For example, the write circuit 111 may write only 4-bit data values as the write data WT_DATA to the memory cell array 101, the 4-bit data values being different from the data values of the pattern data PT_DATA among the data values of the normal write data IP_DATA. Herein, the 4-bit data values refer to the data values when the comparison signal COMP has the logic value of '0'.

Figure 3:
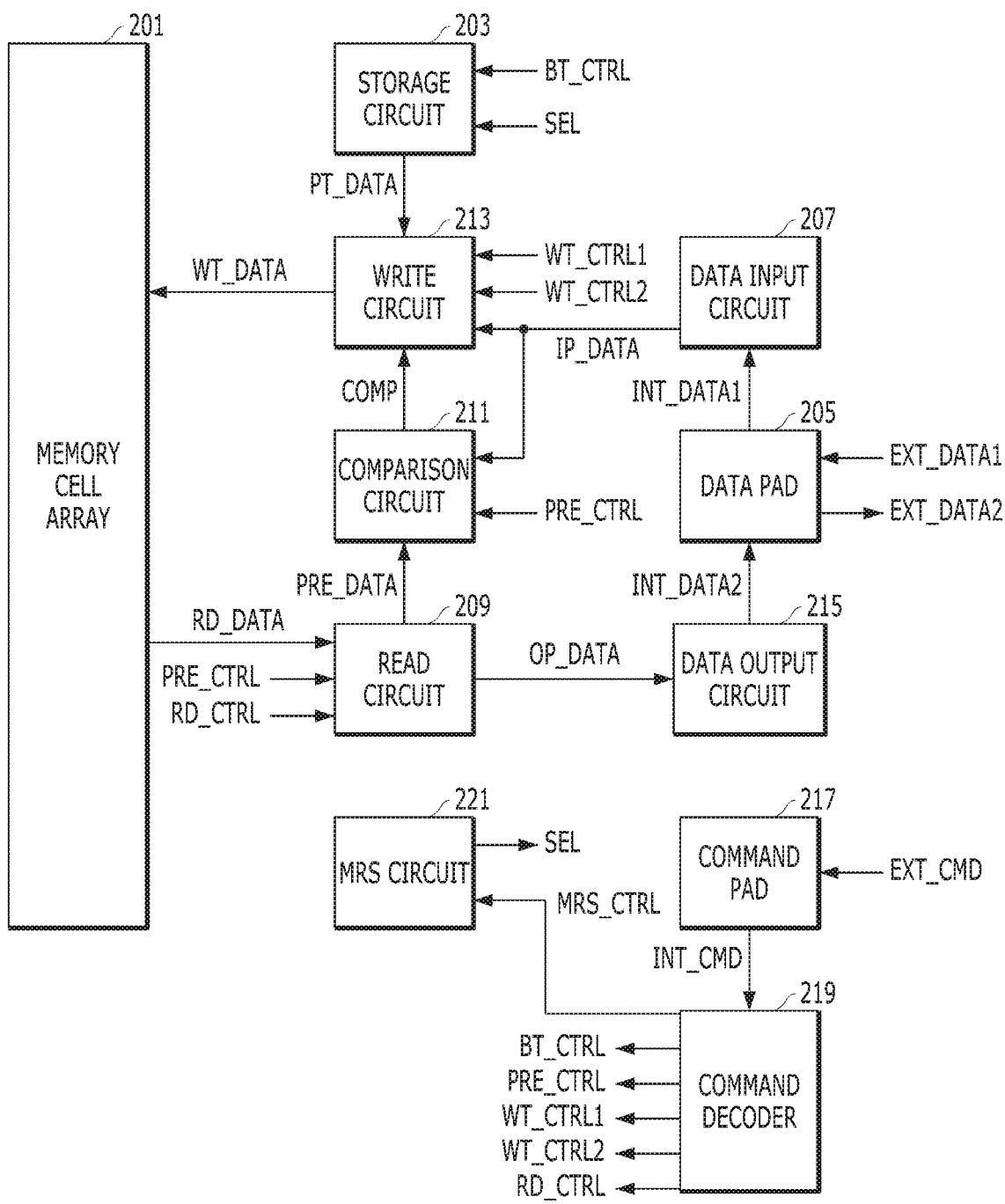
FIG. 3 is a block diagram illustrating a semiconductor memory device in accordance with an embodiment.

FIG. 3 is a block diagram illustrating a semiconductor memory device 200 in accordance with an embodiment.

Referring to FIG. 3, the semiconductor memory device 200 may include a memory cell array 201, a storage circuit 203, a data pad 205, a data input circuit 207, a read circuit 209, a comparison circuit 211, a write circuit 213, a data output circuit 215, a command pad 217, a command decoder 219 and a mode resister set (MRS) circuit 221.

The memory cell array 201 may include a plurality of memory cells (not illustrated). Each of the memory cells may include a variable resistance element. The variable resistance element may include a phase change material.

The storage circuit 203 may store a plurality of pattern data. Each of the plurality of pattern data refers to a pattern of data values which are frequently generated when a corresponding application is executed. The application refers to software such as an application program. In other words, each of the pattern data may include a pattern in which first data values, i.e., '0s', and second data values, i.e., '1s', are patterned in a predetermined order, according to the corresponding application. For example, a first pattern data may have a pattern of '01010101', in which the first data values and the second data values are alternately patterned, and a second pattern data may include a pattern of '00001111', in which the first data values and the second data values are repeatedly patterned by a predetermined number. Alternatively, the plurality of pattern data may include a pattern in various ways depending on each application. The plurality of pattern data may be stored in the storage circuit 203 in a test mode. The storage circuit 203 may include, for example, a fuse circuit and a register.

The storage circuit 203 may select one pattern data PT_DATA among the plurality of pattern data based on a selection control signal SEL, and output the selected pattern data PT_DATA to the write circuit 213 based on an output control signal BT_CTRL.

The data pad 205 may transfer external write data EXT_DATA1 is inputted from an external device, i.e., a host (not illustrated), as internal write data INT_DATA1 to the data input circuit 207. The data pad 205 may transfer internal read data INT_DATA2 inputted from the data output circuit 215 as external read data EXT_DATA2 to the external device.

The data input circuit 207 may generate normal write data IP_DATA based on the internal write data INT_DATA1, and output the normal write data IP_DATA to the comparison circuit 211 and the write circuit 213. For example, the data input circuit 207 may include a general input buffer.

The read circuit 209 may receive read data RD_DATA from the memory cell array 201 based on a pre-read control signal PRE_CTRL, and output written pattern data PRE_DATA corresponding to the read data RD_DATA to the comparison circuit 211. The read circuit 209 may read the read data RD_DATA from the memory cell array 201 based on a normal read control signal RD_CTRL, and output normal read data OP_DATA corresponding to the read data RD_DATA to the data output circuit 215.

The comparison circuit 211 may compare the written pattern data PRE_DATA with the normal write data IP_DATA based on the pre-read control signal PRE_CTRL, and generate a comparison signal COMP corresponding to the comparison result. For example, the comparison circuit 211 may compare data values of the written pattern data PRE_DATA with data values of the normal write data IP_DATA, and generate the comparison signal COMP as the comparison result. When the normal write data IP_DATA has 16-bit data values and the written pattern data PRE_DATA has 16-bit data values, the comparison signal COMP may have 16-bit comparison values. The comparison values may refer to the result values obtained by sequentially comparing the data values of the normal write data IP_DATA with the data values of the written pattern data PRE_DATA one bit by one bit. For example, each of the comparison values may have a logic value of '1' when the corresponding data value of the normal write data IP_DATA is equal to the corresponding data value of the written pattern data PRE_DATA, and have a logic value of '0' when the corresponding data value of the normal write data IP_DATA is different from the corresponding data value of the written pattern data PRE_DATA. For another example, each of the comparison values may have a logic value of '0' when the corresponding data value of the normal write data IP_DATA is equal to the corresponding data value of the pattern data PT_DATA, and have a logic value of '1' when the corresponding data value of the normal write data IP_DATA is different from the corresponding data value of the pattern data PT_DATA.

The write circuit 213 may write the selected pattern data PT_DATA as write data WT_DATA to the memory cell array 201 based on a pre-write control signal WT_CTRL1. In addition, the write circuit 213 may write some of the normal write data IP_DATA as the write data WT_DATA to the memory cell array 201 based on a normal write control signal WT_CTRL2 and the comparison signal COMP. For example, the write circuit 213 may write, to the memory cell array 201, only data values which are different from the data values of the written pattern data PRE_DATA, among the data values of the normal write data IP_DATA. Detailed descriptions thereof will be provided below (refer to FIG. 4).

The data output circuit 215 may generate the internal data INT_DATA2 based on the normal read data OP_DATA. For example, the data output circuit 215 may include a general output buffer.

The command pad 217 may transfer an external command signal EXT_CMD inputted from the external device as an internal command signal INT_CMD to the command decoder 219.

The command decoder 219 may generate an MRS control signal MRS_CTRL, the output control signal BT_CTRL, the pre-read control signal PRE_CTRL, the pre-write control signal WT_CTRL1, the normal write control signal WT_CTRL2 and the normal read control signal RD_CTRL based on the internal command signal INT_CMD. For example, the command decoder 219 may activate the MRS control signal MRS_CTRL, the output control signal BT_CTRL and the pre-write control signal WT_CTRL1 in a boot-up mode. For another example, the command decoder 219 may activate the pre-read control signal PRE_CTRL and the normal write control signal WT_CTRL2 in a write mode. For another example, the command decoder 219 may activate the normal read control signal RD_CTRL in a read mode.

Hereinafter, an operation of the semiconductor memory device 200 having the aforementioned structure in accordance with the present embodiment will be described with reference to FIG. 4.

FIG. 4 is a table illustrating an operation of the semiconductor memory device 200 shown in FIG. 3.

Referring to FIG. 4, the plurality of pattern data may be stored in the storage circuit 203 in the test mode. For example, the plurality of pattern data may be stored in the storage circuit 203 through a fuse programming operation. Each of the plurality of pattern data may include a pattern in which the first data values, i.e., '0's, and the second data values, i.e., '1's, are patterned in a predetermined order, according to a corresponding application.

In the boot-up mode, when the external command signal EXT_CMD is inputted, the command pad 217 may transfer the external command signal EXT_CMD as the internal command signal INT_CMD to the command decoder 219. The command decoder 219 may activate the MRS control signal MRS_CTRL, the output control signal BT_CTRL and the pre-write control signal WT_CTRL1 based on the internal command signal INT_CMD. Accordingly, the MRS circuit 221 may generate the selection control signal SEL based on the MRS control signal MRS_CTRL, and the storage circuit 203 may select one pattern data PT_DATA among the plurality of pattern data based on the selection control signal SEL. For example, the selected pattern data PT_DATA may include 16-bit data values, i.e., '1010101010101010'. The storage circuit 203 may output the selected pattern data PT_DATA to the write circuit 213 based on the output control signal BT_CTRL. The write circuit 213 may write the selected pattern data PT_DATA as the write data WT_DATA to the memory cell array 201 based on the pre-write control signal WT_CTRL1.

In the write mode, when the external command signal EXT_CMD is inputted, the command pad 217 may transfer the external command signal EXT_CMD as the internal command signal INT_CMD to the command decoder 219. The command decoder 219 may activate the pre-read control signal PRE_CTRL and the normal write control signal WT_CTRL2 based on the internal command signal INT_CMD. When the external write data EXT_DATA is inputted, the data pad 205 may transfer the external write data EXT_DATA1 as the internal write data INT_DATA1 to the data input circuit 207. The data input circuit 207 may generate the normal write data IP_DATA based on the internal write data INT_DATA1. For example, the normal write data IP_DATA may include 16-bit data values, i.e., '1010101000000000'.

In the write mode, the read circuit 209 may read the read data RD_DATA corresponding to the selected pattern data PT_DATA from the memory cell array 201, and output the read data RD_DATA as the written pattern data PRE_DATA to the comparison circuit 211, based on the pre-read control signal PRE_CTRL. The comparison circuit 211 may compare the written pattern data PRE_DATA with the normal write data IP_DATA, and generate the comparison signal COMP corresponding to the comparison result. For example, the comparison circuit 211 may sequentially compare the data values of the written pattern data PRE_DATA, i.e., '1010101010101010', with the data values of the normal write data IP_DATA, i.e., '1010101000000000', and generate the comparison results for the respective data values as the comparison signal COMP. For example, the comparison signal COMP may include 16-bit logic values, i.e., '1111111101010101'. Accordingly, as shown in FIG. 4, the write circuit 213 may write only some data values ('0 0 0 0') of the normal write data IP_DATA as the write data WT_DATA to the memory cell array 201 based on the normal write control signal WT_CTRL2 and the comparison signal COMP. For example, the write circuit 213 may write only 4-bit data values as the write data WT_DATA to the memory cell array 201, the 4-bit data values being different from the data values of the pattern data PT_DATA, among the data values of the normal write data IP_DATA. Herein, the 4-bit data values indicate the data values when the comparison signal COMP has the logic value of '0'.

As is apparent from the above descriptions, the semiconductor is memory device has an advantage that only some data values of the normal write data may be written in the write mode.

In accordance with the embodiments, as the number of memory cells to be written in the write mode is minimized, power consumption may be minimized, and the lifespans of the memory cells may be maximized.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. A semiconductor memory device comprising:
    a memory cell array;
    a storage circuit suitable for storing pattern data;
    a data input circuit suitable for receiving normal write data from an external device;
    a comparison circuit suitable for comparing the pattern data with the normal write data based on a pre-read control signal, and generating a comparison signal corresponding to the comparison result; and
    a write circuit suitable for writing the pattern data to the memory cell array based on a pre-write control signal, and writing some of the normal write data to the memory cell array based on a normal write control signal and the comparison signal.

2. The semiconductor memory device of claim 1, wherein the pattern data includes a first data value and a second data value being patterned in a predetermined order.

3. The semiconductor memory device of claim 1, wherein the storage circuit includes any one of a register and a fuse circuit.

4. The semiconductor memory device of claim 1, wherein the comparison circuit sequentially compares data values of the normal write data with data values of the pattern data.

5. The semiconductor memory device of claim 1, wherein the write circuit writes data values to the memory cell array, the data values being different from data values of the pattern data, among data values of the normal write data.

6. The semiconductor memory device of claim 1, wherein the pre-write control signal is activated in a boot-up mode, and the pre-read control signal and the normal write control signal are activated in a write mode.

7. The semiconductor memory device of claim 6, wherein the pre-read control signal is activated ahead of the normal write control signal.

8. A semiconductor memory device comprising:
a memory cell array;
a storage circuit suitable for storing a plurality of pattern data, each having a pattern including a first data value and a second data value being patterned in a different order according to each application, and outputting selected pattern data among the plurality of pattern data based on a selection control signal;
a data input circuit suitable for receiving normal write data from an external device, the normal write data being provided in response to the application;
a write circuit suitable for writing the selected pattern data to the memory cell array based on a pre-write control signal; a read circuit suitable for reading the pattern data written to the memory cell array, based on a pre-read control signal; and
a comparison circuit suitable for comparing the written pattern data with the normal write data, and generating a comparison signal corresponding to the comparison result,
wherein the write circuit suitable writes some of the normal write data to the memory cell array based on a normal write control signal and the comparison signal.

9. The semiconductor memory device of claim 8, wherein the storage circuit includes any one of a register and a fuse circuit.

10. The semiconductor memory device of claim 8, further comprising a mode register set (MRS) circuit suitable for generating the selection control signal.

11. The semiconductor memory device of claim 8, wherein the comparison circuit sequentially compares data values of the normal write data with data values of the pattern data.

12. The semiconductor memory device of claim 8, wherein the write circuit writes data values to the memory cell array, the data values being different from data values of the pattern data, among data values of the normal write data.

13. The semiconductor memory device of claim 8, wherein the pre-write control signal is activated in a boot-up mode, and the pre-read control signal and the normal write control signal are activated in a write mode.

14. The semiconductor memory device of claim 13, wherein the pre-read control signal is activated ahead of the normal write control signal.

15. An operating method of a semiconductor memory device, comprising:
writing pattern data to a memory cell array in a boot-up mode, the pattern data having a pattern in which a first data value and a second data value are patterned in a predetermined order; and
comparing data values of the pattern data with data values of write data, and writing some of the data values of the write data to the memory cell array based on the comparison result, in a write mode.

16. The operating method of claim 15, further comprising storing the pattern data in a storage circuit in a test mode.

17. The operating method of claim 16, wherein the write mode includes:
reading the pattern data from the storage circuit;
sequentially comparing the data values of the pattern data with the data values of the write data; and
writing some of the data values of the write data to the memory cell array based on the comparison result of the comparing of the data values of the pattern data and the data values of the write data.

18. The operating method of claim 15, wherein the write mode includes: reading the pattern data written to the memory cell array in the boot-up mode from the memory cell array; sequentially comparing the data values of the pattern data, which are read in the reading of the pattern data, with the data values of the write data; and writing some of the data values of the write data to the memory cell array based on the comparison result of the comparing of the data values of the pattern data and the data values of the write data.

* * * * *